United States Patent
Srinivasan et al.

(10) Patent No.: US 11,150,971 B1
(45) Date of Patent: Oct. 19, 2021

(54) PATTERN RECOGNITION FOR PROACTIVE TREATMENT OF NON-CONTIGUOUS GROWING DEFECTS

(71) Applicant: INTERNATIONAL BUSINESS MACHINES CORPORATION, Armonk, NY (US)

(72) Inventors: Uma Srinivasan, Poughkeepsie, NY (US); K. Paul Muller, Wappingers Fall, NY (US); Kevin W. Kark, Poughkeepsie, NY (US); Pamela Antal, Abilene, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/841,918

(22) Filed: Apr. 7, 2020

(51) Int. Cl.
*G06F 11/30* (2006.01)
*G06F 11/07* (2006.01)
*G11B 20/18* (2006.01)

(52) U.S. Cl.
CPC ...... *G06F 11/0727* (2013.01); *G06F 11/0751* (2013.01); *G11B 20/1816* (2013.01)

(58) Field of Classification Search
CPC ............. G06F 11/0727; G06F 11/0751; G11B 20/1816
See application file for complete search history.

(56) References Cited

U.S. PATENT DOCUMENTS

| | | | | |
|---|---|---|---|---|
| 5,917,724 A | * | 6/1999 | Brousseau | G11B 20/1816 700/81 |
| 7,047,438 B2 | * | 5/2006 | Smith | G11B 20/1883 369/47.14 |
| 7,103,732 B1 | | 9/2006 | Chang et al. | |
| 7,219,275 B2 | | 5/2007 | Chang et al. | |
| 7,529,997 B2 | | 5/2009 | Meaney et al. | |
| 7,793,173 B2 | | 9/2010 | Chang et al. | |
| 8,589,760 B1 | | 11/2013 | Kou et al. | |
| 9,406,390 B2 | | 8/2016 | Kim et al. | |
| 9,606,889 B1 | | 3/2017 | Herzi et al. | |
| 2006/0200726 A1 | | 9/2006 | Gittins et al. | |

(Continued)

OTHER PUBLICATIONS

IBM, "z/Architecture—Principles of Operation," IBM Publication No. SA22-7832-12, Thirteenth Edition, Sep. 2019, pp. 1-2000.

(Continued)

*Primary Examiner* — Matthew M Kim
*Assistant Examiner* — Kyle Emanuele
(74) *Attorney, Agent, or Firm* — Steven Chiu, Esq.; Kevin P. Radigan, Esq.; Heslin Rothenberg Farley & Mesiti P.C.

(57) ABSTRACT

Pattern recognition is used to proactively treat defects of repeating circuit topologies. A component of a computing environment is monitored for failures. The component includes one or more repeating circuit topologies. A determination is made as to whether a new failure within a repeating circuit topology of the one or more repeating circuit topologies has occurred within a predefined amount of time from a previous failure matching a selected pattern, in which the selected pattern indicates a non-contiguous growing defect. Based on determining the new failure has occurred within the predefined amount of time from the previous failure matching the selected pattern, corrective action for the component is proactively taken.

20 Claims, 12 Drawing Sheets

SYSTEMATIC, REPETITIVE FAIL LOCATIONS

(56) References Cited

U.S. PATENT DOCUMENTS

2008/0155304 A1 6/2008 Chen et al.
2019/0287635 A1 9/2019 Lee
2021/0027205 A1* 1/2021 Sevakula .............. G06F 11/008

OTHER PUBLICATIONS

Mell, Peter and Tim Grance, "The NIST Definition of Cloud Computing," National Institute of Standards and Technology, Information Technology Laboratory, Special Publication 800-145, Sep. 2011, pp. 1-7.

* cited by examiner

US 11,150,971 B1

PATTERN RECOGNITION FOR PROACTIVE TREATMENT OF NON-CONTIGUOUS GROWING DEFECTS

BACKGROUND

One or more aspects relate, in general, to facilitating processing within a computing environment, and in particular, to detecting and managing defects within the computing environment.

As an example, a computing environment includes one or more repeating circuit topologies, such as devices that store data, referred to herein as data storage devices. A data storage device includes arrays of data storage cells, also referred to as cells, used to store data. An example data storage device is memory.

When a data storage device within the computing environment has a defect, it may manifest itself as one or a few failed data storage cells within a small area. When neighboring cells adjacent to the failed cells also start failing, the term growing defect is used. Detection and treatment of these defects are addressed by existing techniques.

However, there are situations in which non-adjacent cells also fail. As an example, a common root cause, such as a chemical-mechanical polishing (CMP) scratch or crack, can cause cells to fail, which are not adjacent to each other, but physically further apart. Such defects are not recognized as a growing defect.

SUMMARY

Shortcomings of the prior art are overcome, and additional advantages are provided through the provision of a computer program product for facilitating processing within a computing environment. The computer program product includes at least one computer readable storage medium readable by at least one processing circuit and storing instructions for performing a method. The method includes monitoring a component of the computing environment for failures. The component includes one or more repeating circuit topologies. A determination is made as to whether a new failure within a repeating circuit topology of the one or more repeating circuit topologies has occurred within a predefined amount of time from a previous failure matching a selected pattern, in which the selected pattern indicates a non-contiguous growing defect. Based on determining the new failure has occurred within the predefined amount of time from the previous failure matching the selected pattern, corrective action for the component is proactively taken.

Computer-implemented methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

One or more aspects relate to using a location and time based fail history to proactively perform corrective action in repeating circuit topologies, such as data storage devices (e.g., memory or any other device that stores data), input/output (I/O) devices, and/or other repeating circuit topologies of a component, such as a chip. A multitude of failing units within one or more repeating circuit topologies, such as failing cells of one or more data storage devices, developing over time, based on the same root cause, such as a scratch or a crack, form a fail pattern. The pattern may be, for instance, any repeating pattern, such as a straight line, a curve, a circle, a perimeter pattern, any other repetitive pattern, etc. By detecting a pattern of defects, proactive action may be taken, such as sparing or deleting one or more failing units, in which sparing includes using a spare unit instead of the failing unit. Other proactive actions include replacing and/or deleting one or more repeating circuit topologies that include failing units, replacing and/or deleting a component (e.g., a chip) that includes failing units, and/or performing other actions. In one example, the failing units include one or more units that are not adjacent to one another and may also, optionally, include one or more adjacent units.

Figure 1:
FIG. 1 depicts one example of systematic, repetitive fail locations within a component, such as a chip, in accordance with an aspect of the present invention.

An example of systematic, repetitive fail locations is depicted in FIG. 1. As shown, a chip 100 includes one or more processor cores 102. Each processor core 102 includes a plurality of cell arrays 104 used for data storage (see, e.g., rectangular boxes in FIG. 1, some of which are designated by reference number 104). As an example, the cell arrays are part of one or more repeating circuit topologies, such as data storage devices (e.g., memory). Each cell array 104 includes a plurality of data storage cells, also referred to as cells. One or more cells within a cell array 104 may fail, and a plurality of failed cells 106 are indicated in FIG. 1 (see bold dots in the cell arrays). As shown, failed cells 106 are at specific locations (e.g., specific addresses) within cell arrays 104.

Figure 2A:
FIG. 2A depicts one example of a growing bit line fail within a component, in accordance with an aspect of the present invention.
Figure 2B:
FIG. 2B depicts one example of a growing word line fail within a component, in accordance with an aspect of the present invention.
Figure 2C:
FIG. 2C depicts one example of a growing scratch defect within a component, in accordance with an aspect of the present invention.
Figure 2D:
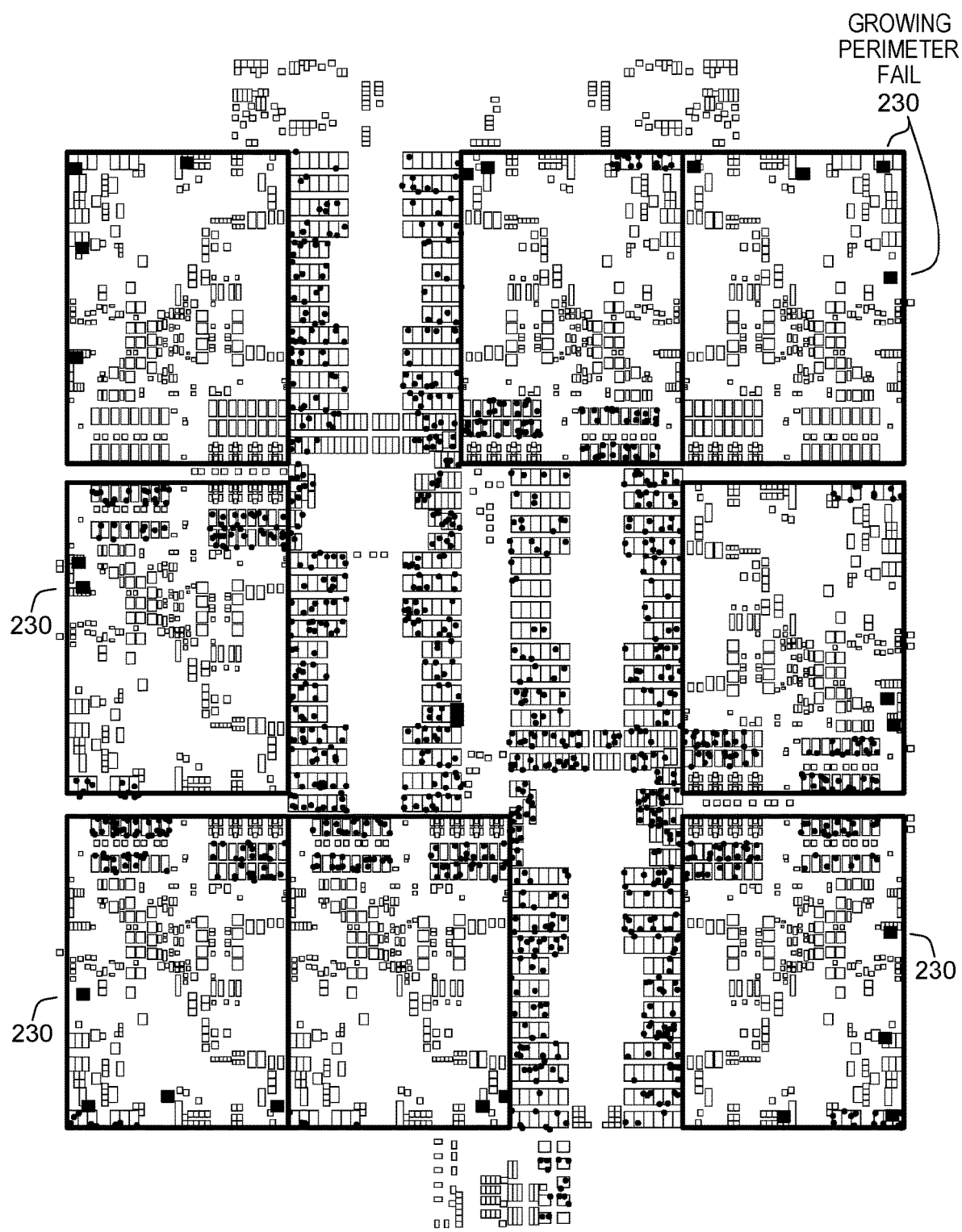
FIG. 2D depicts one example of a growing perimeter fail of a component, in accordance with an aspect of the present invention.

Cell failures may define a pattern. For instance, a growing bit line fail pattern 200 within a component, such as a chip (e.g., chip 100) is shown in FIG. 2A; a growing word line fail pattern 210 within a component is depicted in FIG. 2B; a growing scratch defect 220 within a component is shown in FIG. 2C; and a growing perimeter fail pattern 230 of a component is depicted in FIG. 2D. A perimeter fail pattern may be caused, for instance, by moisture ingress across a moisture barrier at an edge of the chip. Other types of patterns may also be detected. As shown, the patterns may be in, for instance, one or more cell arrays of one or more repeating circuit topologies of a component.

In accordance with one or more aspects, if within a predefined time window (e.g., within 30 days or any other selected time window) of an earlier cell fail of a repeating circuit topology (e.g., a data storage device, such as memory), additional cells start failing, the growth of a defect can be observed. If this growth affects cells which are physically further apart, pattern recognition is used to determine that a non-contiguous growing defect is present. Then, in accordance with an aspect, sparing or deletion of selected cells is initiated, proactively. This can prevent a system outage, such as an outage within a computing environment that includes the cell arrays.

In a further aspect, the degree of repair (in, e.g., %) and/or the manner in which the repair is executed at Time0 (e.g., wafer and module final test, system test) are considered in determining whether a pattern exists and/or whether proactive action is to be taken. For example, any systematic or repetitive repairs; and/or repair strategies on other chips in the field, which may have come from the same wafer and/or similar location on the wafer, are considered. The degree of repair to indicate a pattern and/or to take proactive action is selectable.

Figure 3A:
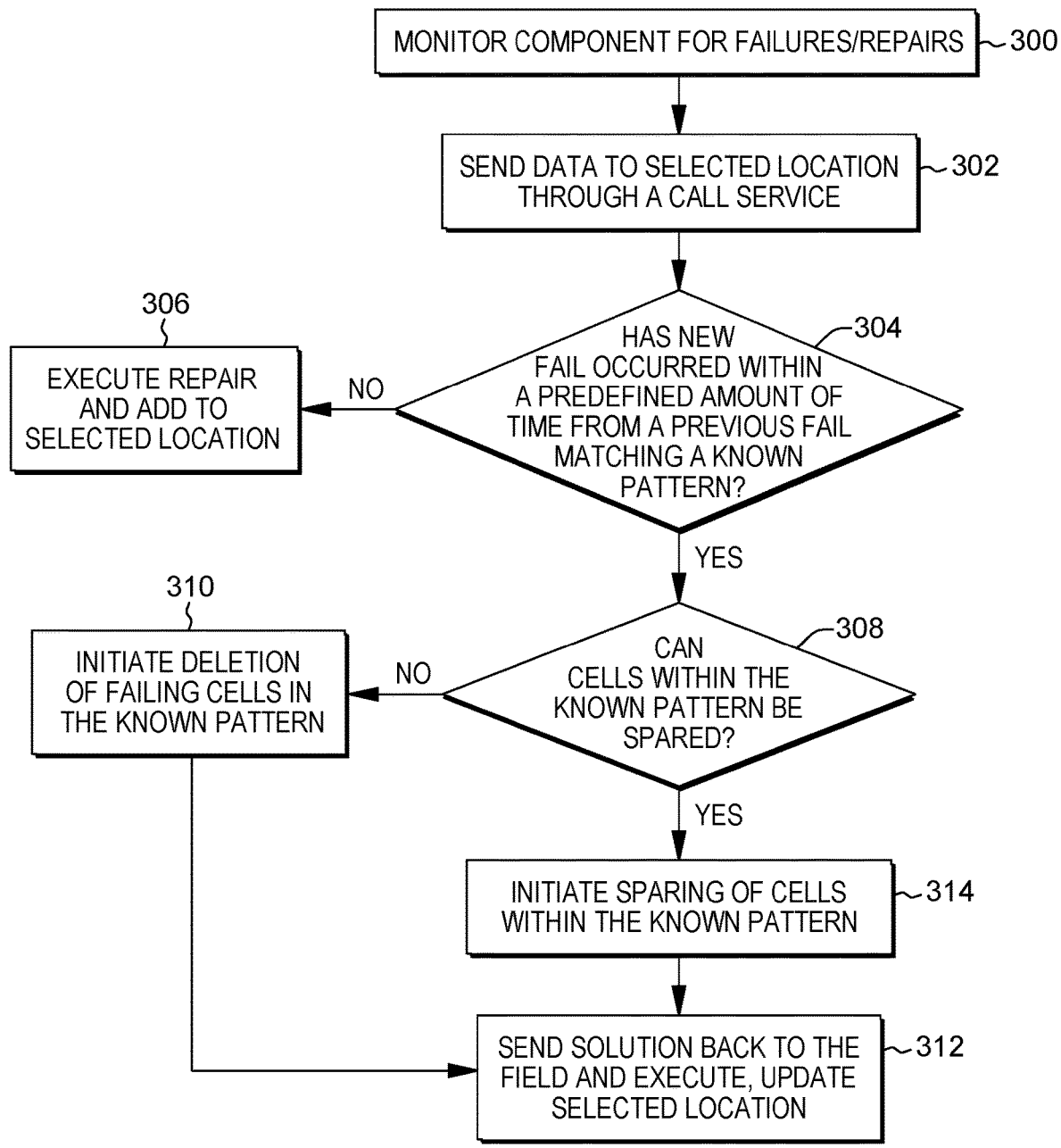
FIG. 3A depicts one example of a processing flow that uses a location and time based fail history to proactively perform corrective action, in accordance with an aspect of the present invention.

Further details relating to detecting a pattern of fails and proactively taking an action based thereon are described with reference to FIG. 3A. In one example, the processing in FIG. 3A is performed by at least one processor (e.g., processor 524 of FIG. 5, described below) and/or using pre-defined firmware algorithms. The at least one processor may be, e.g., a part of a computing environment that includes a component being monitored or coupled thereto.

Referring to FIG. 3A, a component, such as a chip (e.g., chip 100), is monitored for failures and/or repairs, such as failures/repairs of one or more cell arrays (e.g., cell array 104 of one or more repeating circuit topologies of the component), STEP 300. As an example, failures (e.g., data storage cell failures) are monitored and logged during regular processor operation (e.g., in the field). The data obtained from the monitoring is sent to a selected location, such as a data warehouse (e.g., an IBM® system data warehouse), through a call service, such as a Call Home service offered by International Business Machines Corporation, Armonk, N.Y., STEP 302. IBM is a registered trademark or trademark of International Business Machines Corporation in at least one jurisdiction.

A determination is made as to whether a new fail (e.g., data storage cell failure of a repeating circuit topology within the component) occurred within a predefined amount of time (e.g., 30 days or any other selected time) from a previous fail (e.g., within the component) that matches a known pattern, INQUIRY 304. For instance, a monitor is executed to compare one or more new logged fail addresses (of, e.g., one or more physical locations of the component) to addresses of prior fails (of, e.g., the component) to determine if the new fails match a known pattern (e.g., a straight line, a curve, a circle, a perimeter pattern, other repetitive pattern, etc.), in the predefined time period. If there is no new fail that meets the criteria, then a repair of the failed cell is performed and an indication of the repair and/or of the failure is added to the selected location (e.g., data warehouse), STEP 306.

However, if there is a new fail that meets the criteria, then a determination is made as to whether the cells (e.g., all of the cells) within the known pattern can be spared, INQUIRY 308. If the cells cannot be spared, then, in one example, deletion of the failing cells in the known pattern is initiated, STEP 310. Further, the solution is sent back to the field and executed, and the selected location (e.g., data warehouse) is updated, STEP 312.

Returning to INQUIRY 308, if the cells (e.g., all the cells) within the known pattern can be spared, then sparing of the cells within the known pattern is initiated, STEP 314. The solution is then sent back to the field and executed, and the selected location (e.g., data warehouse) is updated, STEP 312.

In another embodiment, the cells that can be spared are spared and those cells that cannot be spared are deleted. Other variations are also possible.

As described above, based on detecting a pattern of fails within a selected time period, repairs are initiated proactively. For example, assume a new fail of a cache occurred. A determination is made as to whether any other cells matching a known pattern of failures in the same chip in, e.g., the past 30 days has occurred. The data warehouse shows the fail history of the impacted data storage device cells. If a new fail found in the data storage device along with prior fails matches the known pattern, captured in the last 30 days, corrective action is taken. As examples, sparing of the data storage cells within the pattern is performed, the data storage cells are marked as failed so that they are not used, and/or one or more of the data storage cells, one or more repeating circuit topologies and/or the component are replaced. Thus, using a location and time based fail history, corrective action is performed proactively in repeating circuit topologies, such as data storage devices (e.g., memory), input/output (I/O) devices, and/or other repeating circuit topologies, prior to a system outage.

In a further aspect, instead of performing sparing for the known pattern of failing cells or deleting the known pattern of failing cells by making them unavailable for use, a call service (e.g., Call Home) is used to initiate other corrective actions. These actions include, for instance, replacing one or more cells, replacing one or more repeating circuit topologies, replacing one or more chips, etc.

In yet a further aspect, the corrective actions taken are dependent on the criticality of the data storage device involved. For areas that are critical for system operation, if sparing is not an option or if close to the sparing limit (i.e., a limit of a number of cells that can be spared in, e.g., a cell array), a call home action may be triggered. Areas that are considered critical may be pre-specified as critical or determined based on processing, as examples.

Figure 3B:
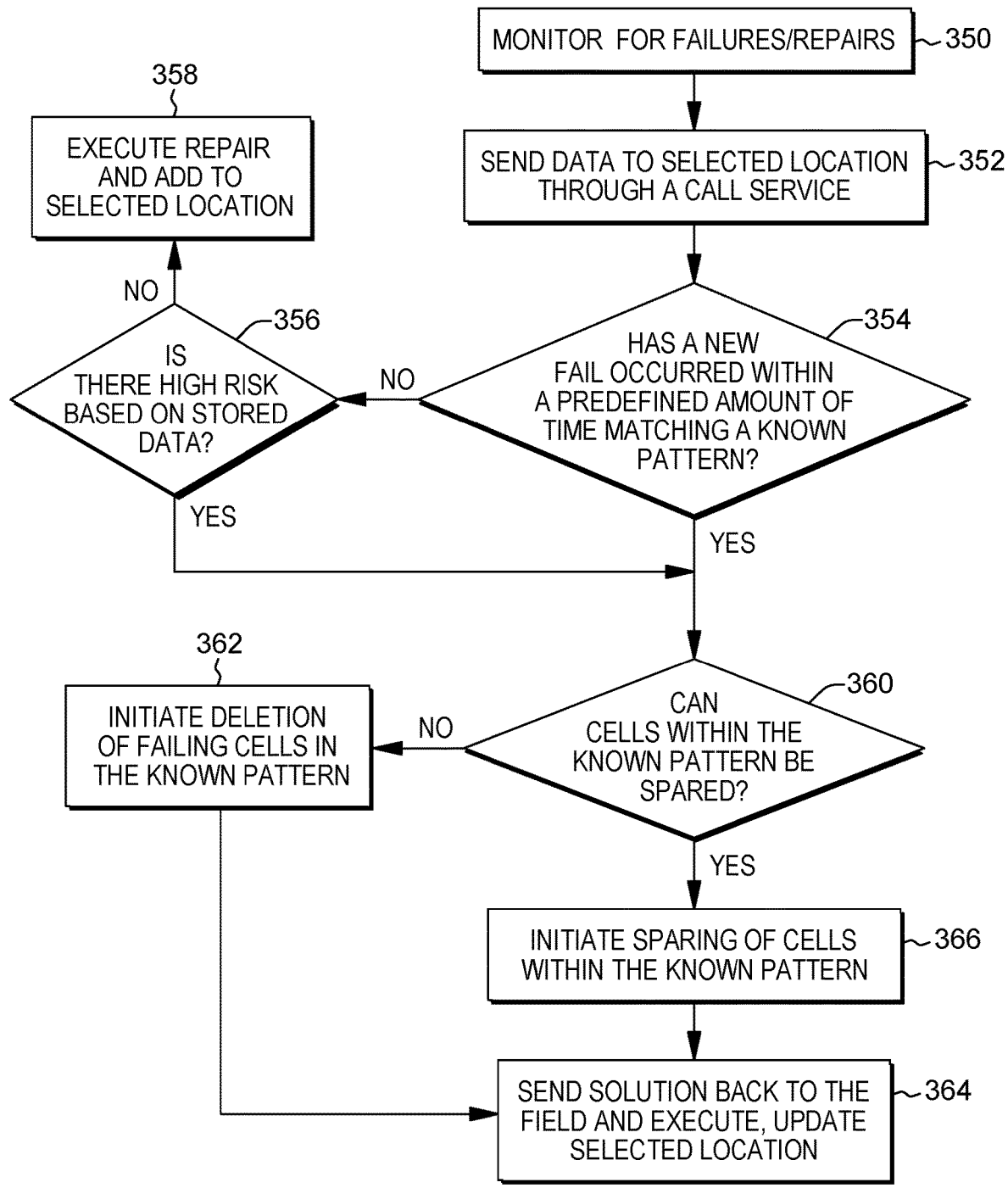
FIG. 3B depicts another example of a processing flow that uses a location and time based fail history to proactively perform corrective action, in accordance with an aspect of the present invention.

In a further aspect, corrective action may be proactively taken even if a new fail has not occurred but there is, for instance, a selected amount of risk (e.g., a certain %, a high risk) of a failure occurring. Further details of an embodiment of detecting a pattern and proactively taking an action based on a certain risk level is described with reference to FIG. 3B. In one example, the processing in FIG. 3B is performed by at least one processor (e.g., processor 524 of FIG. 5, described below) and/or using pre-defined firmware algorithms. The at least one processor may be, e.g., a part of a computing environment that includes a component being monitored or coupled thereto.

Referring to FIG. 3B, in one example, a component, such as a chip (e.g., chip 100), is monitored for failures and/or repairs, such as failures/repairs of one or more data storage cell arrays (e.g., array 104) of one or more repeating circuit topologies, STEP 350. As an example, failures (e.g., data storage cell failures) are monitored and logged during regular processor operation. The data obtained from the monitoring is sent to a selected location, such as a data warehouse (e.g., an IBM® system data warehouse), through a call service, such as the Call Home service offered by International Business Machines Corporation, STEP 352.

A determination is made as to whether a new fail (e.g., data storage cell failure of a repeating circuit topology of the component) occurred within a predefined amount of time (e.g., 30 days or any other selected time) from a previous fail (e.g., within the component) that matches a known pattern, INQUIRY 354. For instance, a monitor is executed to compare one or more new fail addresses that are logged to addresses of prior fails to determine if the new fails match a known pattern in the predefined time period. If there is no new fail that meets the criteria, then a further determination is made as to whether there is a selected level of risk (e.g., a high risk, a selected % of risk, etc.) of a new fail that meets the criteria based on the data stored in the selected location (e.g., data warehouse), INQUIRY 356. In one example, the risk assessment is based on the data stored in the data warehouse and includes, for instance, checking whether the repeating circuit topology that includes the new failure has had a selected number of repairs and/or evaluating other fails within the repeating circuit topology or the component. In further examples, the assessment includes, e.g., whether the memory or other component in question was heavily repaired (e.g., had a selected % of repairs, such as greater than 50% or any other selected percentage) as compared to other repairs or as compared to a selected amount or number of repairs at Time0; whether other cells within the pattern were already deleted or spared; whether several fails occurred within the same pattern, but just outside the preset time window; whether other chips on the same wafer had sparing and/or deletion; whether the identified chip comes from a poor vintage lot; and/or whether the new cell fail together with the previous cell fails show a systematic and repetitive pattern, which is known to cause system level problems. If, for instance, one or more of the above assessments are met, then, in one embodiment, the selected level of risk (e.g., high risk) is present.

If there is not a selected level of risk (e.g., high risk) of a new fail that meets the criteria, then a repair of the failed cell is performed and an indication of the repair and/or failure is added to the selected location (e.g., data warehouse), STEP 358. However, if there is a selected level of risk (e.g., high risk) of a new fail that meets the criteria, then a determination is made as to whether the sparing of the cells (e.g., all the cells) within the known pattern can be performed, INQUIRY 360. If sparing of the cells (e.g., all the cells) cannot be performed, then deletion of the failing cells in the known pattern is initiated, STEP 362. Further, the solution is sent back to the field and executed, and the selected location (e.g., data warehouse) is updated, STEP 364.

Returning to INQUIRY 360, if sparing of the cells (e.g., all the cells) within the known pattern can be performed, then sparing of the cells within the known pattern is initiated, STEP 366. The solution is then sent back to the field and executed, and the selected location (e.g., data warehouse) is updated, STEP 364.

In another embodiment, the cells that can be spared are spared and those cells that cannot be spared are deleted.

In one or more aspects, a location and time based fail history is used to proactively perform corrective action in repeating circuit topologies, such as data storage devices (e.g., memory), input/output (I/O) devices, and/or other repeating circuit topologies. In other aspects, predictive analysis of new cell failures compared to prior repair history is used. One or more aspects may be applied to any repairable circuit, including but not limited to, memory, including but not limited to static random access memory (SRAM), dynamic random access memory (DRAM), and other memory; other data storage devices; I/O devices; logic; and/or other circuits.

In one or more aspects, machine learning, as an example, may be used for, e.g.: predictive analysis and/or other analyses; determining whether there is a selected level of risk (e.g., high risk); determining a fail pattern; and/or for one or more other aspects of the present invention. Machine learning algorithms generate and train algorithms to create a model utilized to train and/or evaluate an artificial intelligence-based machine service. For instance, in an initialization stage, program code (e.g., hardware and/or software) trains these algorithms, based on, for instance, patterns and/or other data.

Figure 4:
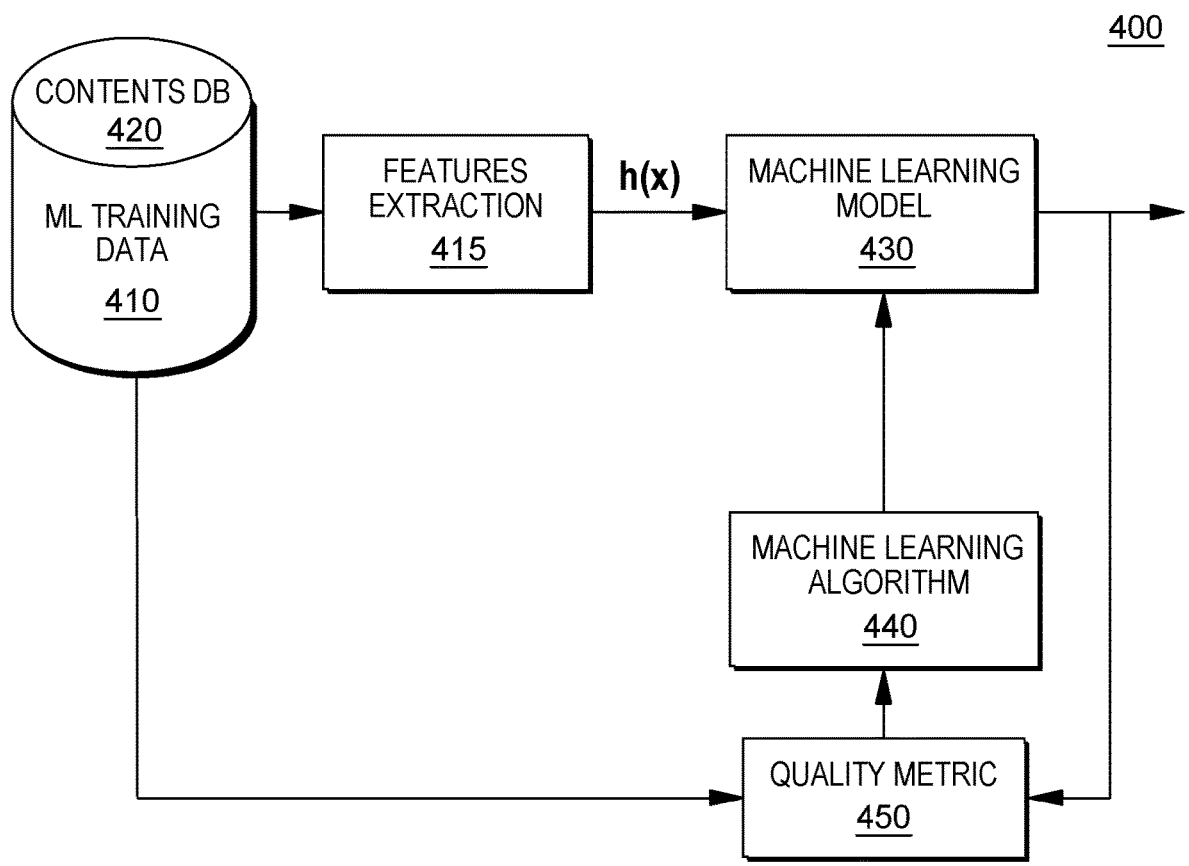
FIG. 4 depicts one example of using machine learning in one or more aspects of the present invention.

FIG. 4 is an example of a machine learning training system 400 utilized, in one or more aspects, to perform cognitive analyses of various inputs, including training data, test data, collected data, generated data and/or other data. Training data utilized to train the model in one or more embodiments of the present invention includes, for instance, data that is specific to what is being learned. The program code in embodiments of the present invention performs a cognitive analysis to generate data structures, including algorithms utilized by the program code to perform predictive analysis and/or to analyze data. Machine learning (ML) solves problems that are not solved with numerical means alone. In this ML-based example, program code extracts various features/attributes/data from ML training data 410 (e.g., information collected from various data sources relevant to the training), which may be resident in one or more databases 420 (e.g., the IBM data warehouse) comprising subject-related data and general data. Features extraction 415 is utilized to develop a predictor function, h(x), also referred to as a hypothesis, which the program code utilizes as a machine learning model 430.

In identifying various states and/or behaviors indicative of states in the ML training data 410, the program code can utilize various techniques including, but not limited to, mutual information, which is an example of a technique that can be utilized to identify features (e.g., elements, patterns, attributes, etc.). Further varying techniques may be used to select features, including but not limited to, diffusion mapping, principal component analysis, recursive feature elimination (a brute force approach to selecting features), and/or a Random Forest, to select the attributes related to various subject states. The program code may utilize a machine learning algorithm 440 to train the machine learning model

430 (e.g., the algorithms utilized by the program code), including providing weights for the conclusions, so that the program code can train the predictor functions that comprise the machine learning model 430. The conclusions may be evaluated by a quality metric 450. By selecting a diverse set of ML training data 410, the program code trains the machine learning model 430 to identify and weight various attributes (e.g., features, patterns, data) that correlate to various states of a subject (e.g., data storage cells, etc.).

The model generated by the program code is self-learning as the program code updates the model based on active feedback received from subjects (e.g., updated data and/or other input). For example, when the program code determines that there is material to be learned that was not previously predicted by the model, the program code utilizes a learning agent to update the model to reflect that information, in order to improve predictions in the future. Additionally, when the program code determines that a prediction is incorrect, based on, for instance, obtaining additional data, the program code updates the model to reflect the inaccuracy of the prediction for the given period of time. Program code comprising a learning agent cognitively analyzes the data deviating from the modeled expectations and adjusts the model in order to increase the accuracy of the model, moving forward.

In one or more embodiments, program code executing on one or more processors, utilizes an existing cognitive analysis tool or agent to tune the model, based on data obtained from the various data sources. One or more embodiments utilize, for instance, the IBM Watson® system as the cognitive agent; however, other cognitive agents may be used. In one or more embodiments, the program code interfaces with, e.g., IBM Watson application programming interfaces (APIs) to perform a cognitive analysis of obtained data.

In one or more embodiments, the program code trains aspects of one or more IBM Watson application program interfaces (APIs) to learn the material being taught. Utilizing an existing cognitive agent, such as the IBM Watson system, expands the type of subject data that the program code can integrate into the model. For example, data can include documentary, text, visual, and audio data, which the program code can process, based on its utilization of the IBM Watson system. Specifically, in one or more embodiments, certain of the APIs of the IBM Watson system comprise a cognitive agent (e.g., learning agent) that includes one or more programs, including, but not limited to, natural language classifiers, Retrieve and Rank (i.e., a service available through the IBM Watson® Developer Cloud™ that can surface the most relevant information from a collection of documents), concepts/visual insights, trade off analytics, document conversion, and/or relationship extraction. In an embodiment, one or more programs analyze the data obtained by the program code across various sources utilizing one or more of a natural language classifier, retrieve and rank APIs, and trade off analytics APIs. The IBM Watson application program interfaces (APIs) can also provide audio related API services, in the event that the collected data includes audio, which can be utilized by the program code, including but not limited to natural language processing, text to speech capabilities, and/or translation.

In one or more embodiments, the program code utilizes a neural network to analyze the collected, learned and/or generated data to generate the model utilized for training, analyzing and/or evaluating. Neural networks are a biologically-inspired programming paradigm which enable a computer to learn from observational data, learned data, generated data, collected data and/or other data. This learning is referred to as deep learning, which is a set of techniques for learning in neural networks. Neural networks, including modular neural networks, are capable of pattern (e.g., state) recognition with speed, accuracy, and efficiency, in situations where data sets are multiple and expansive, including across a distributed network, including but not limited to, cloud computing systems. Modern neural networks are non-linear statistical data modeling tools. They are usually used to model complex relationships between inputs and outputs or to identify patterns (e.g., states) in data (i.e., neural networks are non-linear statistical data modeling or decision-making tools). In general, program code utilizing neural networks can model complex relationships between inputs and outputs and identify patterns in data. Because of the speed and efficiency of neural networks, especially when parsing multiple complex data sets, neural networks and deep learning provide solutions to many problems in multiple source processing, which the program code in one or more embodiments accomplishes when obtaining data and generating a model for evaluation and/or training of artificial intelligence-based processes, such as artificial intelligence-based analysis and evaluation.

One or more embodiments may utilize a neural network (NN) to predict future states of a given subject (e.g., predict future failures). Utilizing the neural network, the program code can predict the likelihood of the given state at a subsequent time. The program code obtains (or derives) data related to the subject and/or content being learned from various sources to generate an array of values (possible states) to input into input neurons of the NN. Responsive to these inputs, the output neurons of the NN produce an array that includes the predicted states. The program code can automatically transmit notifications related to the predicted states based on the perceived validity.

In one or more embodiments, a neuromorphic processor or trained neuromorphic chip can be incorporated into the computing resources executing the program code. One example of a trained neuromorphic chip that is utilized in an embodiment of the present invention is the IBM® TrueNorth Chip™, produced by International Business Machines Corporation. IBM Watson, TrueNorth, and Developer Cloud are trademarks or registered trademarks of International Business Machines Corporation in at least one jurisdiction.

The IBM TrueNorth chip, also referred to as TrueNorth, is a neuromorphic complementary metal-oxide-semiconductor (CMOS) chip. TrueNorth includes a manycore network on a chip design (e.g., 4096 cores), each one simulating programmable silicon "neurons" (e.g., 256 programs) for a total of just over a million neurons. In turn, each neuron has 256 programmable synapses that convey the signals between them. Hence, the total number of programmable synapses is just over 268 million (2^28). Memory, computation, and communication are handled in each of the 4096 neurosynaptic cores, so TrueNorth circumvents the von-Neumann-architecture bottlenecks and is very energy-efficient.

One or more aspects of the present invention are inextricably tied to computer technology and facilitate processing within a computing environment. A capability is provided to proactively take one or more actions to prevent system failures based on a location and time based fail history. This improves system performance by avoiding system failures, enabling processors to continue processing, and/or by minimizing the amount of processing that has to be repeated (e.g., such as a memory access due to a failing memory cell).

Further, one or more aspects of the present invention are inextricably tied to computing and improve the technical fields of artificial intelligence, including artificial intelligence-based evaluation and analysis, and/or machine learning, as examples. Technological improvements are provided in machine predictions, as an example, providing technological improvements in computing by, for instance, improving processing speed and/or efficiency.

Figure 5:
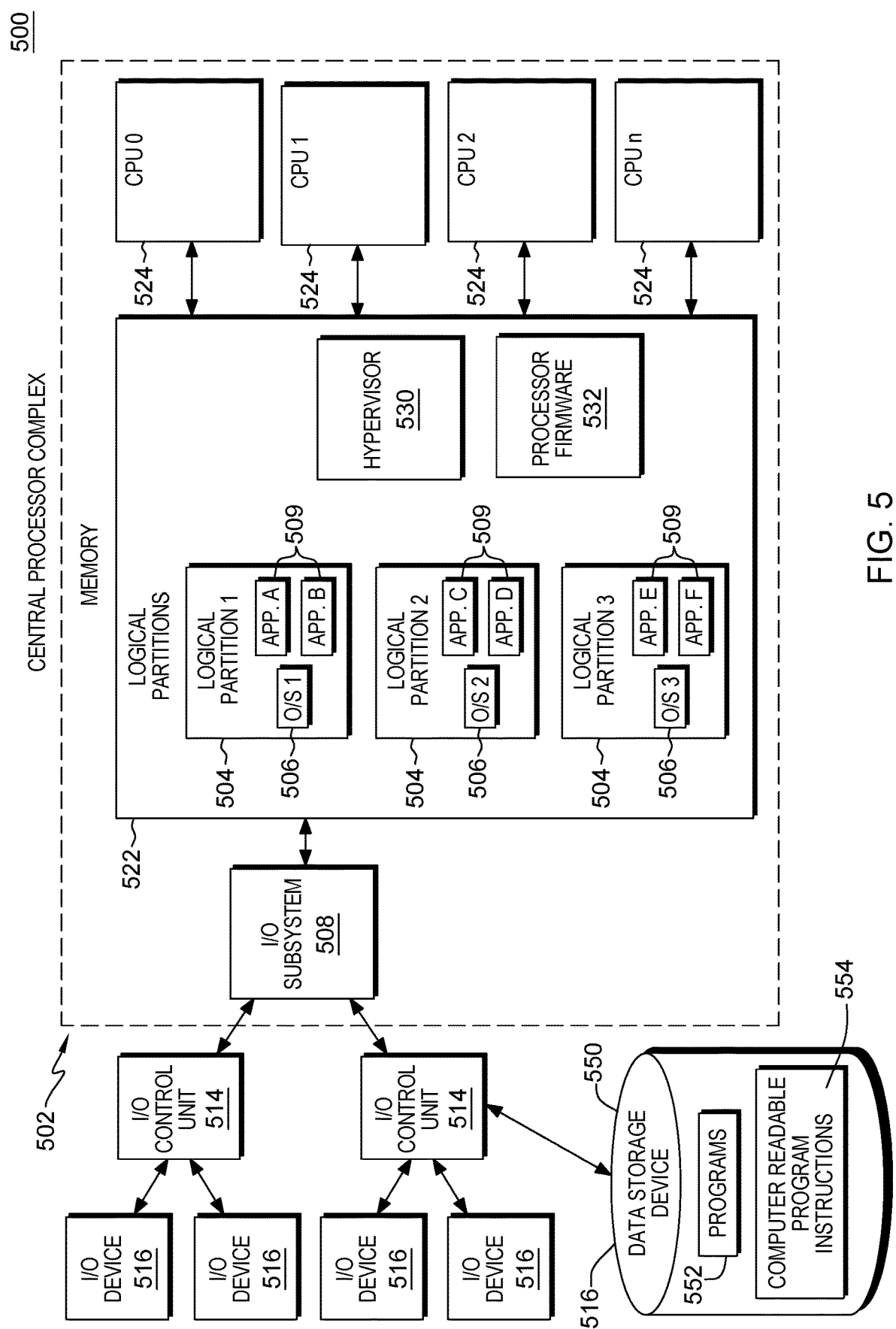
FIG. 5 depicts one example of a computing environment to incorporate and use one or more aspects of the present invention.

One embodiment of a computing environment to incorporate and use one or more aspects of the present invention is described with reference to FIG. 5. In one example, the computing environment is based on the z/Architecture® hardware architecture, an example of which is described in a publication entitled, "z/Architecture Principles of Operation," IBM Publication No. SA22-7832-12, 13$^{th}$ edition, September 2019, which is hereby incorporated herein by reference in its entirety. The z/Architecture hardware architecture, however, is only one example architecture; other architectures and/or other types of computing environments may include and/or use one or more aspects of the present invention.

Details regarding one example computing environment are described with reference to FIG. 5. In one example, a computing environment 500 includes a central processor complex 502 that includes, for instance, a memory 522 (a.k.a., system memory, main memory, main storage, central storage, storage) coupled to one or more processors (a.k.a., central processing units (CPUs)) 524, and to an input/output subsystem 508.

Memory 522 includes, for example, one or more logical partitions 504, a hypervisor 530 that manages the logical partitions, and processor firmware 532. One example of hypervisor 530 is the Processor Resource/System Manager (PR/SM™) hypervisor, offered by International Business Machines Corporation, Armonk, N.Y. As used herein, firmware includes, e.g., the microcode of the processor. It includes, for instance, the hardware-level instructions and/or data structures used in implementation of higher-level machine code. In one embodiment, it includes, for instance, proprietary code that is typically delivered as microcode that includes trusted software or microcode specific to the underlying hardware and controls operating system access to the system hardware. PR/SM is a trademark or registered trademark of International Business Machines Corporation in at least one jurisdiction.

Each logical partition 504 is capable of running an operating system 506, such as a z/OS operating system, or another operating system, and operate with different programs 509.

Memory 522 is coupled to processors (e.g., CPUs) 524, which are physical processor resources that may be allocated to the logical partitions. For instance, a logical partition 504 includes one or more logical processors, each of which represents all or a share of a physical processor resource 524 that may be dynamically allocated to the logical partition.

Further, memory 522 is coupled to I/O subsystem 508. I/O subsystem 508 may be a part of the central processor complex or separate therefrom. It directs the flow of information between main storage 522 and input/output control units 514 and/or input/output (I/O) devices 516 coupled to the central processor complex.

Many types of I/O devices 516 may be used. One particular type is a data storage device 550. Data storage device 550 may store one or more programs 552, one or more computer readable program instructions 554, and/or data, etc. The computer readable program instructions may be configured to carry out functions of embodiments of aspects of the invention.

Central processor complex 502 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with central processor complex 502. Examples include, but are not limited to: microcode, device drivers, redundant processing units, external disk drive arrays, RAID systems, tape drives, and data archival storage systems, etc.

Moreover, central processor complex 502 may be operational with numerous other general-purpose or special purpose computing system environments or configurations. Examples of well-known computing systems, environments, and/or configurations that may be suitable for use with central processor complex 502 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

In one or more aspects, memory 522 is one example of a repeating circuit topology that includes a plurality of cell arrays (e.g., cell arrays 104) having a plurality of cells, which are monitored for failing cells (e.g., cells 106). The monitoring is used to detect a failure pattern within a predetermined time frame and to proactively perform one or more actions based on detecting the pattern. Although memory is an example of a repeating circuit topology, one or more aspects of the present invention may be used with other repeating circuit topologies.

Although various embodiments are described herein, many variations and other embodiments are possible without departing from a spirit of aspects of the present invention. It should be noted that, unless otherwise inconsistent, each aspect or feature described herein, and variants thereof, may be combinable with any other aspect or feature.

Figure 6A:
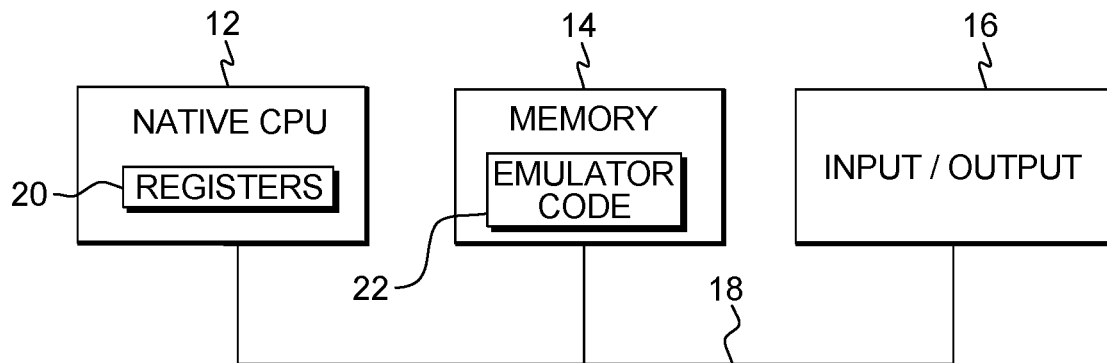
FIG. 6A depicts another example of a computing environment to incorporate and use one or more aspects of the present invention.

Aspects of the present invention may be used by many types of computing environments. Another embodiment of a computing environment to incorporate and use one or more aspects of the present invention is described with reference to FIG. 6A. In this example, a computing environment 10 includes, for instance, a native central processing unit (CPU) 12, a memory 14, and one or more input/output devices and/or interfaces 16 coupled to one another via, for example, one or more buses 18 and/or other connections. As examples, computing environment 10 may include a PowerPC® processor offered by International Business Machines Corporation, Armonk, N.Y.; an HP Superdome with Intel Itanium II processors offered by Hewlett Packard Co., Palo Alto, Calif.; and/or other machines based on architectures offered by International Business Machines Corporation, Hewlett Packard, Intel Corporation, Oracle, or others. PowerPC is a trademark or registered trademark of International Business Machines Corporation in at least one jurisdiction. Intel and Itanium are trademarks or registered trademarks of Intel Corporation or its subsidiaries in the United States and other countries.

Native central processing unit 12 includes one or more native registers 20, such as one or more general purpose registers and/or one or more special purpose registers used during processing within the environment. These registers include information that represents the state of the environment at any particular point in time.

Moreover, native central processing unit 12 executes instructions and code that are stored in memory 14. In one particular example, the central processing unit executes emulator code 22 stored in memory 14. This code enables the computing environment configured in one architecture to emulate another architecture. For instance, emulator code 22 allows machines based on architectures other than the z/Architecture hardware architecture, such as PowerPC processors, HP Superdome servers or others, to emulate the z/Architecture hardware architecture and to execute software and instructions developed based on the z/Architecture hardware architecture.

Figure 6B:
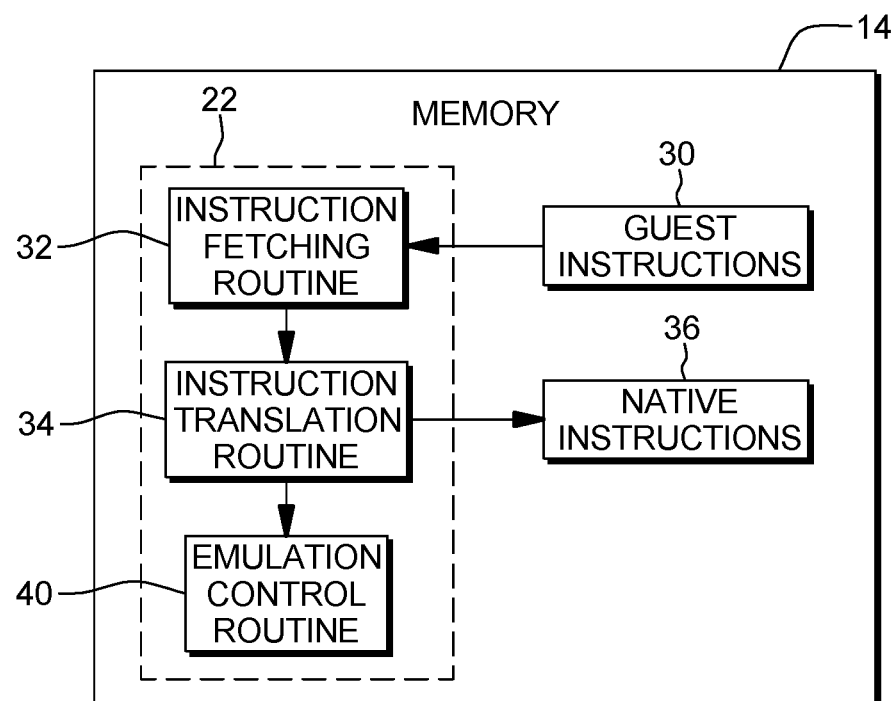
FIG. 6B depicts further details of the memory of FIG. 6A.

Further details relating to emulator code 22 are described with reference to FIG. 6B. Guest instructions 30 stored in memory 14 comprise software instructions (e.g., correlating to machine instructions) that were developed to be executed in an architecture other than that of native CPU 12. For example, guest instructions 30 may have been designed to execute on a processor based on the z/Architecture hardware architecture, but instead, are being emulated on native CPU 12, which may be, for example, an Intel Itanium II processor. In one example, emulator code 22 includes an instruction fetching routine 32 to obtain one or more guest instructions 30 from memory 14, and to optionally provide local buffering for the instructions obtained. It also includes an instruction translation routine 34 to determine the type of guest instruction that has been obtained and to translate the guest instruction into one or more corresponding native instructions 36. This translation includes, for instance, identifying the function to be performed by the guest instruction and choosing the native instruction(s) to perform that function.

Further, emulator code 22 includes an emulation control routine 40 to cause the native instructions to be executed. Emulation control routine 40 may cause native CPU 12 to execute a routine of native instructions that emulate one or more previously obtained guest instructions and, at the conclusion of such execution, return control to the instruction fetch routine to emulate the obtaining of the next guest instruction or a group of guest instructions. Execution of the native instructions 36 may include loading data into a register from memory 14; storing data back to memory from a register; or performing some type of arithmetic or logic operation, as determined by the translation routine.

Each routine is, for instance, implemented in software, which is stored in memory and executed by native central processing unit 12. In other examples, one or more of the routines or operations are implemented in firmware, hardware, software or some combination thereof. The registers of the emulated processor may be emulated using registers 20 of the native CPU or by using locations in memory 14. In embodiments, guest instructions 30, native instructions 36 and emulator code 22 may reside in the same memory or may be disbursed among different memory devices.

The computing environments described above are only examples of computing environments that can be used. Other environments, including but not limited to, non-partitioned environments, partitioned environments, and/or emulated environments, may be used; embodiments are not limited to any one environment. Although various examples of computing environments are described herein, one or more aspects of the present invention may be used with many types of environments. The computing environments provided herein are only examples.

Each computing environment is capable of being configured to include one or more aspects of the present invention. For instance, each may be configured to monitor for failures/repairs, send the monitored data to a data store, analyze the data, initiate a corrective action based on the monitored data, and/or take corrective action based on the monitored data.

One or more aspects include, for instance: a capability to translate a logical address from a failed address register to a physical address in memory; a fail history table that contains repairs applied to the memory and the total number of repairs available for the memory on the chip; software/logic to determine if the new fail is within the known pattern of a prior fail within a set time period and to flag the failure; and/or software/logic to determine the corrective action proactively based on detecting a growing defect. One or more aspects include software-based detection of fails and corrective actions for individual systems deployed in the field based on a predefined set of rules, as well as pattern recognition to further refine the rules and apply them to the systems in use. Further, one or more aspects assess the risk of the current repair strategy based on the repair history of the chip, and the behavior of other chips from the same wafer using the data warehouse. One or more aspects apply to repeating circuit topologies other than memory.

One or more aspects may relate to cloud computing.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
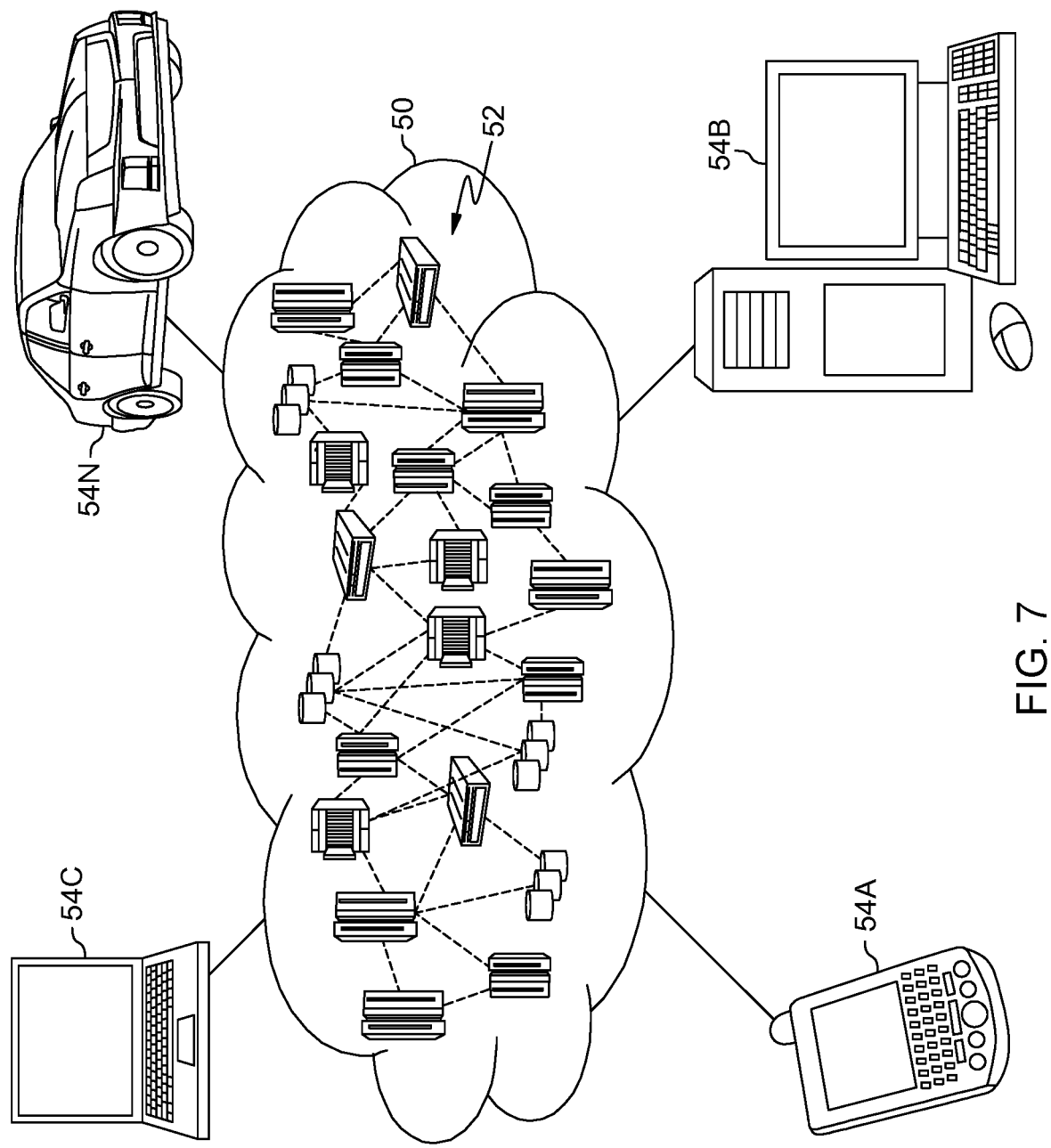
FIG. 7 depicts one embodiment of a cloud computing environment.

Referring now to FIG. 7, illustrative cloud computing environment 50 is depicted. As shown, cloud computing environment 50 includes one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 52 and cloud computing environment 50 can communicate with any type of computerized device over any type of network and/or network addressable connection (e.g., using a web browser).

Figure 8:
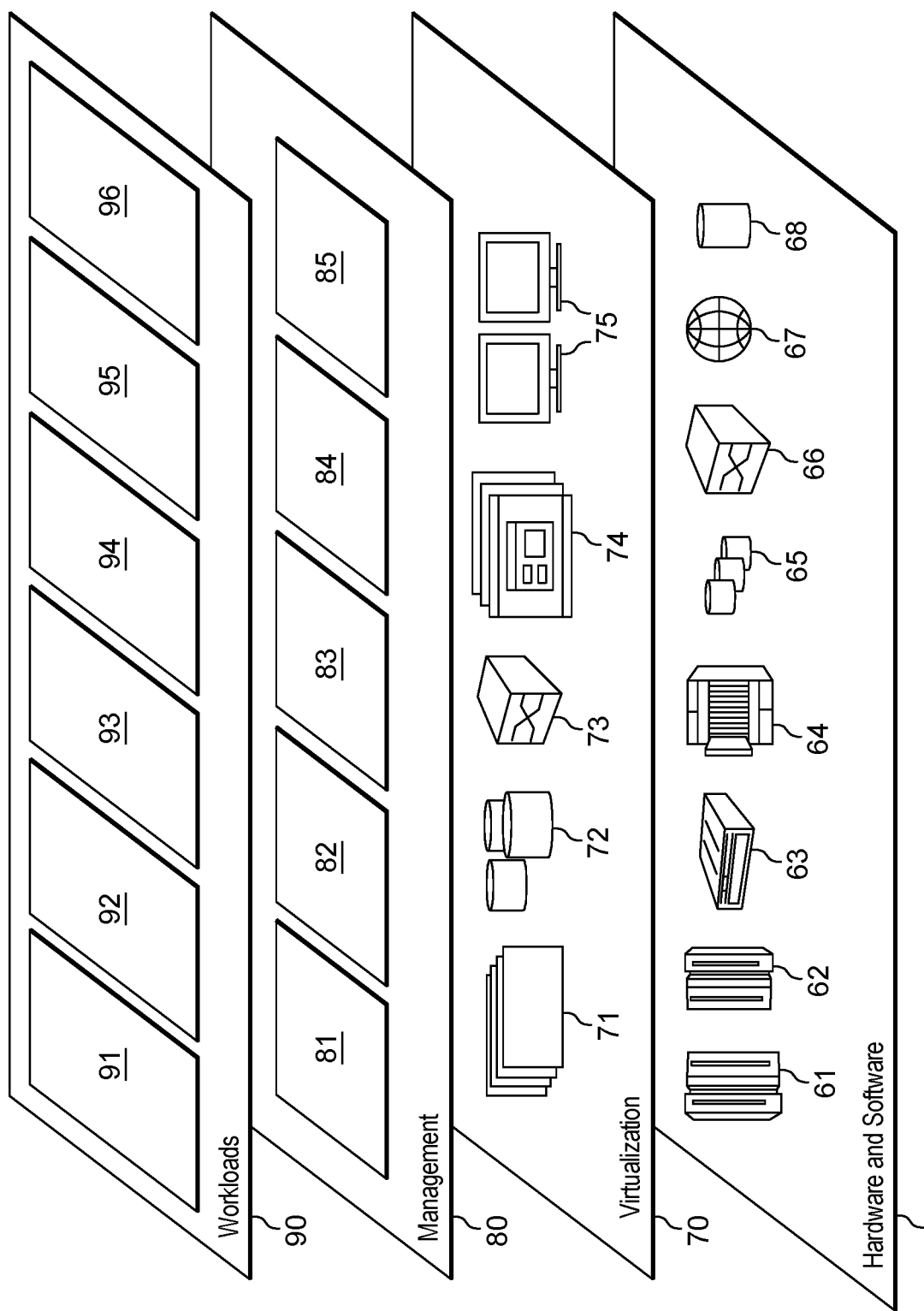
FIG. 8 depicts one example of abstraction model layers.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and pattern recognition and proactive treatment processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally, or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different pattern recognition techniques may be used. Additionally, other components may take advantage of one or more aspects of the present invention. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer program product for facilitating processing within a computing environment, the computer program product comprising:
    at least one computer readable storage medium readable by at least one processing circuit and storing instructions for performing a method comprising:
        monitoring during operation a component of the computing environment for unit failures, the component being a hardware component that includes one or more repeating circuit topologies with a plurality of units;
        based on the monitoring, determining that a new unit failure has occurred within a predefined amount of time from a previous unit failure matching a selected pattern, the selected pattern indicating existence of a non-contiguous growing defect in the component; and
        proactively taking a corrective action on the component within the selected pattern, based on determining that the new unit failure has occurred within the predefined amount of time from the previous unit failure matching the selected failure pattern, indicating the existence of the non-contiguous growing defect in the component.

2. The computer program product of claim 1, wherein the proactively taking corrective action comprises performing at least one selected action on one or more units within the selected pattern prior to an outage within the computing environment.

3. The computer program product of claim 2, wherein the one or more units are data storage cells, and the at least one selected action comprises initiating sparing of one or more data storage cells within the selected pattern.

4. The computer program product of claim 2, wherein the one or more units are data storage cells, and the at least one selected action comprises deleting one or more failing data storage cells within the selected pattern.

5. The computer program product of claim 2, wherein the one or more units are data storage cells, and the at least one selected action is an action selected from a group of actions consisting of: initiating sparing of one or more data storage cells within the selected pattern, deleting one or more failing data storage cells within the selected pattern, and initiating a corrective action other than the sparing and the deleting.

6. The computer program product of claim 1, wherein the method further comprises based on determining that the new unit failure has not occurred within the predefined amount of time from the previous unit failure matching the selected pattern, determining whether there is a selected level of risk that there will be another unit failure within the predefined amount of time from the previous unit failure matching the selected pattern, and wherein the proactively taking the corrective action is performed based on determining there is the selected level of risk.

7. The computer program product of claim 6, wherein the determining whether there is the selected amount of risk includes checking whether the repeating circuit topology that includes the new unit failure has had a selected number of repairs.

8. The computer program product of claim 6, wherein the determining whether there is the selected amount of risk includes evaluating other unit fails within the repeating circuit topology that includes the new unit fail or the component including the repeating circuit topology.

9. The computer program product of claim 1, wherein the monitoring includes:
determining that one or more unit failures within the one or more repeating circuit topologies has occurred; and
storing information relating to the one or more unit failures in a data structure.

10. The computer program product of claim 1, wherein the selected pattern is a pattern that repeats.

11. A computer system for facilitating processing within a computing environment, the computer system comprising:
at least one processor configured to perform:
monitoring during operation a component of the computing environment for unit failures, the component being a hardware component that includes one or more repeating circuit topologies with a plurality of units;
based on the monitoring, determining that a new unit failure has occurred within a predefined amount of time from a previous unit failure matching a selected pattern, the selected pattern indicating existence of a non-contiguous growing defect in the component; and
proactively taking a corrective action on the component within the selected pattern, based on determining that the new unit failure has occurred within the predefined amount of time from the previous unit failure matching the selected failure pattern, indicating the existence of the non-contiguous growing defect in the component.

12. The computer system of claim 11, wherein the proactively taking corrective action comprises performing at least one selected action on one or more units within the selected pattern prior to an outage within the computing environment.

13. The computer system of claim 12, wherein the one or more units are data storage cells, and the at least one selected action comprises initiating sparing of one or more data storage cells within the selected pattern.

14. The computer system of claim 12, wherein the one or more units are data storage cells, and the at least one selected action comprises deleting one or more failing data storage cells within the selected pattern.

15. The computer system of claim 11, wherein the method further comprises based on determining that the new unit failure has not occurred within the predefined amount of time from the previous unit failure matching the selected pattern, determining whether there is a selected level of risk that there will be another unit failure within the predefined amount of time from the previous unit failure matching the selected pattern, and wherein the proactively taking the corrective action is performed based on determining there is the selected level of risk.

16. A computer-implemented method of facilitating processing within a computing environment, the computer-implemented method comprising:
monitoring during operation a component of the computing environment for unit failures, the component being a hardware component that includes one or more repeating circuit topologies with a plurality of units;
based on the monitoring, determining that a new unit failure has occurred within a predefined amount of time from a previous unit failure matching a selected pattern, the selected pattern indicating existence of a non-contiguous growing defect in the component; and
proactively taking a corrective action on the component within the selected pattern, based on determining that the new unit failure has occurred within the predefined amount of time from the previous unit failure matching the selected failure pattern indicating the existence of the non-contiguous growing defect in the component.

17. The computer-implemented method of claim 16, wherein the proactively taking corrective action comprises performing at least one selected action on one or more units within the selected pattern prior to an outage within the computing environment.

18. The computer-implemented method of claim 17, wherein the one or more units are data storage cells, and the at least one selected action comprises initiating sparing of one or more data storage cells within the selected pattern.

19. The computer-implemented method of claim 17, wherein the one or more units are data storage cells, and the at least one selected action comprises deleting one or more failing data storage cells within the selected pattern.

20. The computer-implemented method of claim 16, further comprising based on determining that the new unit failure has not occurred within the predefined amount of time from the previous unit failure matching the selected pattern, determining whether there is a selected level of risk that there will be another unit failure within the predefined amount of time from the previous unit failure matching the selected pattern, and wherein the proactively taking the corrective action is performed based on determining there is the selected level of risk.

* * * * *